United States Patent [19]
Kuhlmann-Schäfer

[11] 3,935,058
[45] Jan. 27, 1976

[54] ZONE MELTING PROCESS
[75] Inventor: Wilhelm H. Kuhlmann-Schäfer, Hannover, Germany
[73] Assignee: Preussag Aktiengesellschaft, Germany
[22] Filed: June 21, 1974
[21] Appl. No.: 481,819

Related U.S. Application Data
[63] Continuation of Ser. No. 270,692, July 11, 1972, abandoned.

[30] Foreign Application Priority Data
July 15, 1971 Germany............................ 2135305

[52] U.S. Cl............. 156/602; 23/273 SP; 156/608; 156/620
[51] Int. Cl.²......................................... B01J 17/08
[58] Field of Search.................... 23/301 SP, 273 SP

[56] References Cited
UNITED STATES PATENTS

| | | |
|---|---|---|
| 3,046,164 | 7/1962 | Domenicali ..................... 23/301 SP |
| 3,238,024 | 3/1966 | Cremer et al. .................. 23/273 SP |
| 3,378,409 | 4/1968 | Hurle et al. ..................... 23/301 SP |
| 3,470,039 | 9/1969 | Groundry et al. ............... 23/273 SP |
| 3,617,223 | 11/1971 | Boatman ........................ 23/273 SP |

FOREIGN PATENTS OR APPLICATIONS

| | | | |
|---|---|---|---|
| 1,059,916 | 2/1967 | United Kingdom ............ | 23/273 SP |

Primary Examiner—Norman Yudkoff
Assistant Examiner—D. Sanders
Attorney, Agent, or Firm—Molinare, Allegretti, Newitt & Witcoff

[57] ABSTRACT

Increased heat control is obtained in the melting zone of a zone melting process utilizing an electric current passed longitudinally through the charge, to melt the charge, by constricting the melted charge in the melting zone.

12 Claims, 7 Drawing Figures

ZONE MELTING PROCESS

This is a continuation of application Ser. No. 270,692, filed July 11, 1972, now abandoned.

BACKGROUND OF THE INVENTION

The present invention relates to a zone melting process wherein an elongated charge of meltable material has, in a zone migrating in the direction of the longitudinal extent of the charge, a temperature above the melting point of the charge. After the migrating zone, in the direction of migration, the charge has a temperature at least below the melting point, and an electric current is passed through the charge in the longitudinal direction of the charge which is capable of heating the charge to a temperature above the melting point. The charge is cooled to a temperature below the melting point, at least in the region positioned after the migrating zone, in the direction of travel of the zone, according to German Patent Application P 21 25 726.1, the teachings of which are incorporated by reference herein.

From German Pat. No. 1,169,683 a process is known for zone melting a semiconductor rod without the use of a crucible or boat, wherein the molten zone is produced by a radiant energy source directed at right angles to the semiconductor rod and concentrically surrounding the rod. An approximately level course is obtained for the boundaries between the molten zone and the solid semiconductor material supporting it. Heating in the region of the molten zone is to be provided in a substantially linear form. Further, the heating of this region is to be to such an extent that this region is substantially smaller than the length of the molten zone. In brief, to achieve a short molten zone in the longitudinal direction, heating is to be carried out only in a short region. Additionally, heating of the semiconductor rod is provided by a current flowing through it in the longitudinal direction. In this way, it is intended to achieve a general, preferably uniform heating so that the temperature achieved by the heating is below the melting point. The object of this known process is to produce as level a boundary as possible between the liquid phase and the solid phase.

The older patent application P 21 25 726.1, proposes a zone melting process wherein an elongated charge of meltable material has, in a zone migrating in the direction of the longitudinal extent of the charge, a temperature above the melting point and after the migrating zone in the direction of migration, has a temperature at least below the melting point. The particular feature of that process is that the current flowing through the charge in the longitudinal direction is capable of heating the charge to a temperature above the melting point, and that the charge, at least in the region situated after the zone in the direction of travel of the zone, is cooled to a temperature below the melting point. In this way it is not necessary to introduce energy in the region of the melting zone for producing and maintaining the melting zone, as was the case with the process proposed in German Pat. No. 1,169,683. The current heats the charge in the region of the melting zone above the melting point, and, outside the melting zone, suitable cooling insures that the liquid phase merges into the solid phase or that the charge remains unmelted. With this process the boundary between the liquid phase and the solid phase is substantially a plane.

If the electrical resistance of the charge increases with increasing temperature or, on the solid charge, changing to the liquid phase, the voltage drop across this zone, and therefore the power produced, also rises. Therefore, it is very easy to bring about a stable condition by the cooling. But not all materials exhibit this resistance pattern, so that it becomes more complicated to maintain the necessary conditions.

SUMMARY OF THE INVENTION

The invention has as its object to improve and further develop the older process such as proposed in German Patent Application P 21 25 726.1 in such a manner that the heat produced in the melting zone by the electric current can be regulated in a simple manner, especially in the case of materials having an unfavorable resistance pattern in relation to temperature.

The object of this invention is obtained by carrying along with the region of the melting zone, a cross-section narrower which constricts the cross-section of the charge in the region of the melting zone but does not constrict the charge outside the melting zone.

In other words, the invention proposes narrowing or constricting the cross-section of the charge in the region of the melting zone by mechanical means and thereby increasing the resistance in this region and, as a result, the quantity of heat produced. The cross-section narrower which brings about the mechanical narrowing travels along with the melting zone, and after the cross-section narrower, the cross-section widens again while the charge is still liquid. Only after the cross-section widens does the change to the solid phase take place.

Just before the cross-section narrower, the change from the solid to the liquid phase takes place, so that the liquid travels through the narrower at a velocity increased in accordance with the reduced cross-section.

A further development of the invention consists in that the cross-section narrower is in the form of a plate in which an aperture is provided whose cross-section is smaller than that of the charge. The cross-section narrower is thus an extremely simple means for constricting the cross-section. This cross-section narrower thus substantially replaces the complicated heat source such as is necessary in the process illustrated in the German Pat. No. 1,169,683.

Another further development of the invention consists in that the aperture has a substantially conical inlet and outlet. This form of aperture promotes the entry of the charge in the liquid state into the narrowed aperture and an orderly expansion of the flow pattern of liquid after it passes through the aperture.

Finally, it is possible to have an annular aperture. Thus, by using the process of this invention, it is possible to produce complicated elongated crystal bodies.

DETAILED DESCRIPTION OF THE INVENTION

According to the present invention, it is convenient to press the charge with a constant force against the cross-section narrower. This guarantees a feed which depends on the rate at which the charge melts. If the charge melts relatively quickly, e.g. because of relatively high current intensity on the part of the current flowing through the charge for heating purposes, or due to relative cross-sectional reduction of the charge, the thickness of the molten layer tends to increase. However, this results in a drop in the resistance presented to the charge by the cross-section narrower inlet, and the molten material flows more quickly through the narrowed portion of the cross-section narrower. Thus, there is, more or less, a natural regulation which results in very constant operating conditions. This is particularly advantageous if the entire process is to be carried out in a hermetically sealed chamber, as may be necessary, for example, if unstable or highly volatile substances are to be subjected to zone melting at the melting temperature concerned. These may include, for example, carbides, almost all of the metal oxides, and mixed phases which do not melt congruently.

If the charge is moved at the same velocity relative to the cross-section narrower, as the crystal body produced, the resultant crystal body is given substantially the same cross-section (with the same density) as the charge. When the charge and crystal body move at the same speed, it is preferred to hold the charge and the crystal body jointly, and to produce the constant force by its weight and/or an additional weight. Thus, with this embodiment of the process according to the invention, the charge and the crystal body, in the simplest case, descend because of their own dead weight through the cross-section narrower. In this case, the current must be introduced by a mobile arrangement with the use of stranded cables. Of course, the velocity of the charge and the speed of movement of the crystal body may differ. If the crystal body moves relatively quickly, its cross-section is smaller than that of the charge. In the case of relatively slow movement, the cross-section is greater. It is also possible to influence the cross-section of the crystal body produced by the form of the outlet of the cross-section narrower.

In an alternative embodiment of the process according to the present invention the charge is moved in one operation through a plurality of cross-section narrowers, which are positioned one after the other and each produce melting zones. This modification of the process is particularly suitable for the purification of materials, since the crystallizing (i.e. precipitation) operation takes place several times in succession. The downward movement of the individual particles of the crystal body before the cross-section narrowers can be effected, in the simplest case, by gravitational force. Again, it is possible to have a hermetically closed apparatus even with this complicated way of carrying out the process.

The process provided by the invention will be explained in detail with reference to constructional examples shown in the drawings.

DESCRIPTION OF PREFERRED EMBODIMENTS

Figure 1:
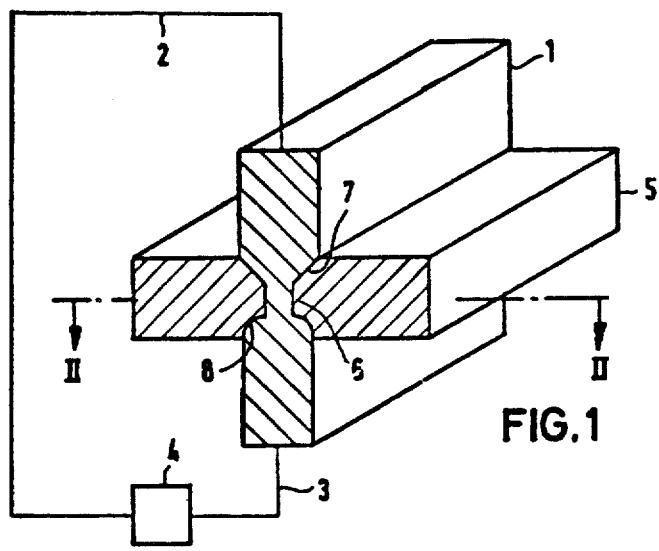
FIG. 1 illustrates schematically, in perspective and section, an apparatus for carrying out the process according to the present invention.

FIG. 1 shows schematically, in perspective and section, a substantially plate-shaped charge 1 which is vertically positioned and is connected above and below a current source 4 by lines 2 and 3.

The cross-section of the charge 1 is reduced and constricted by a plate-shaped, cross-section narrower 5 in which there is positioned a slot-shaped aperture 6 provided with a funnel-shaped inlet 7 and an outlet 6 with a curved wall.

Figure 2:
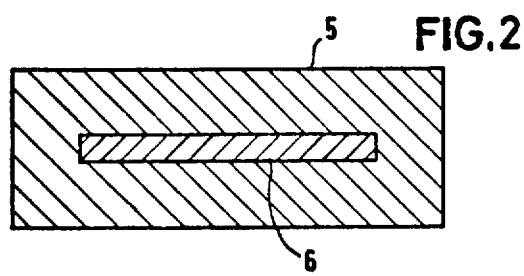
FIG. 2 illustrates a section taken on section line II—II of FIG. 1.

FIG. 2 shows a plan section taken on section line II—II of FIG. 1 and shows clearly the slot-shaped form of the aperture 6 in the cross-section narrower 5.

To carry out the process according to the present invention, the current flows from a conventional current source 4 through lines or wires 2 and 3 through the charge 1. The current is regulated to compensate for any increased electrical resistance in the charge 1 in the region of the aperture 6 due to heat produced in this constricted region and the attendant temperature rises above the melting point of the charge. The portion of the charge closely adjacent to aperture 6 is also brought, by heat transfer, to a liquid state. Heat may also be additional dissipated through the cross-section narrower, so that the liquefied parts of the charge 1 in the region of the inlet 7 flow downward through the aperture 6. Because of the reduced cross-section in the region of the aperture 6, this quantity of heat is increased. The heat decreases again in accordance with the widened cross-section in the outlet 8. Since there is widened cross-section, there is a reduced electrical resistance and the quantity of heat produced is smaller. At the same time, due to the exposure of charge 1, heat dissipation takes place, which may be further promoted by cooling. A change to the solid phase takes place very quickly, and thus crystallizing-out or precipitation takes place in the region of a relatively level surface.

It will be understood that the charge 1, both above and also below the cross-section narrower, moves at the same speed relative to the cross-section narrower 5, so that the cross-sections are the same above and below the cross-section narrower. However, it is also possible, through different velocities for the portions of the charge 1 which are situated either above or below the cross-section narrower 5, to alter the cross-section of that portion of the charge 1 situated below the cross-section narrower 5.

Figure 3:
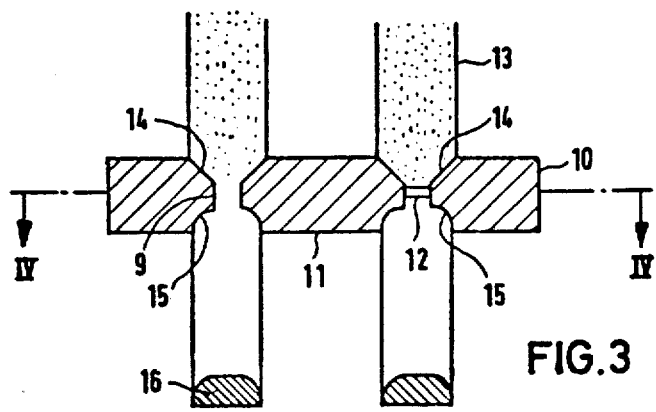
FIG. 3 illustrates a modification of a side view of FIG. 1, showing a cross-section narrower with an annular aperture.

FIG. 3 shows the utilization of the process of the present invention for the production of hollow charges of any desired cross-section. In the example shown in FIG. 3 there is a tube section 13. Accordingly, an aperture 9 of annular shape is provided in a cross-section narrower 10. The radial cross-section of the aperture 9 corresponds substantially to the cross-section of the aperture 6 of the cross-section narrower 5 in FIG. 1, with the difference that the aperture has the shape of a closed ring. A disc-shaped portion 11 of the cross-section narrower 10 is positioned at the center thereof and is held in place by means of webs 12 which extends through the melting zone in the region of the aperture 9 to the outer portion of the cross-section narrower 10. The liquid material of charge 13 flows about these webs and then unites again to form an uninterrupted annular cross-section. An inlet 14 and an outlet 15 are again provided as discussed in relation to FIG. 1.

Figure 4:
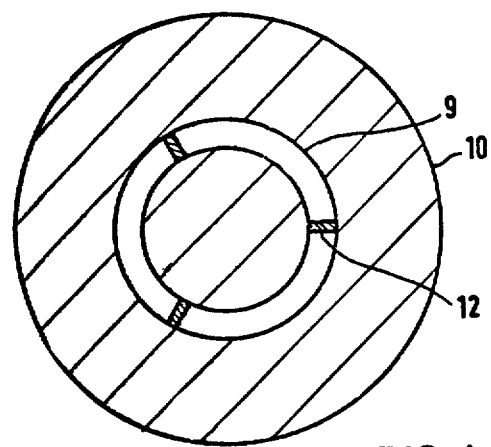
FIG. 4 illustrates a section taken along section line IV—IV of FIG. 3.

In the lower region of the lower portions of the charge 13, there is positioned a ring 16 which consists of a single crystal which acts as a nucleating crystal and effects the formation of a single crystal tube. FIG. 4 illustrates annular aperture 9, narrower 10, and webs 12 in a plan, sectional view.

Figure 5:
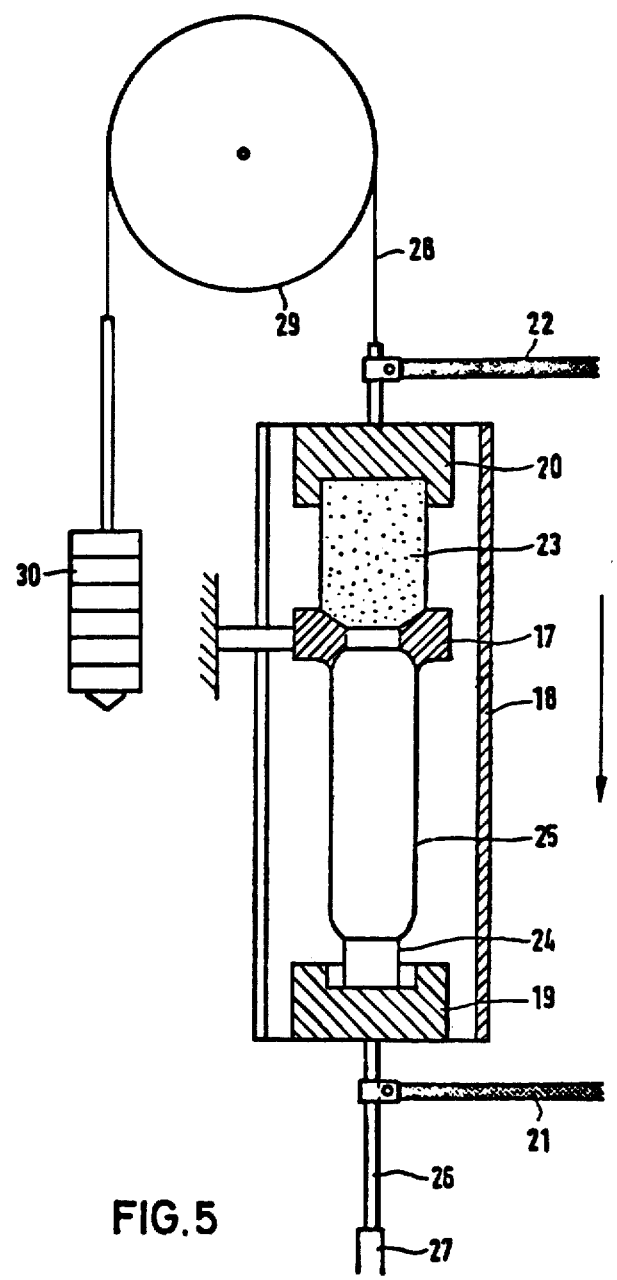
FIG. 5 illustrates an apparatus for carrying out the process of the present invention, wherein the charge is advanced with constant force.

FIG. 5 shows an apparatus for carrying out the process according to the invention wherein the charge is moved with a constant force against the cross-section narrower. A cross-section narrower 17 is held in stationary manner. A ceramic tube 18 holds two electrodes 19 and 20 which are constructed as mounts and are provided with electrical leads 21 and 22 for connection to a suitable current source.

The electrode 20 holds a charge 23. The electrode 19 holds a nucleating crystal 24, so that the crystal body 25 growing on it and formed below the cross-section narrower 17 is a single crystal.

From the electrode 19 there extends downwards a rod 26 which enters a tube 27 and holds the tube 18 with its contents. The tube 18 is suspended by means of the electrode 20 on a cable 28 which is passed over a wheel 29 to weights 30. By means of the weights 30, the weight of the tube 18, the electrodes 19 and 20 and the charge 23, together with the crystal body 25, can be compensated so that the force remaining, in the form of the residual weight, is just great enough for the purposes of the process; namely, the pressing of charge 23 through the cross-section narrower 17. The arrangement shown in FIG. 1 can be left by itself after being started, until the melting zone has migrated through the entire charge. For this reason, it is possible to arrange the entire arrangement in a hermetically sealed chamber such as is necessary when using protective gases or with volatile substances capable of producing a positive vapor pressure.

Figure 6:
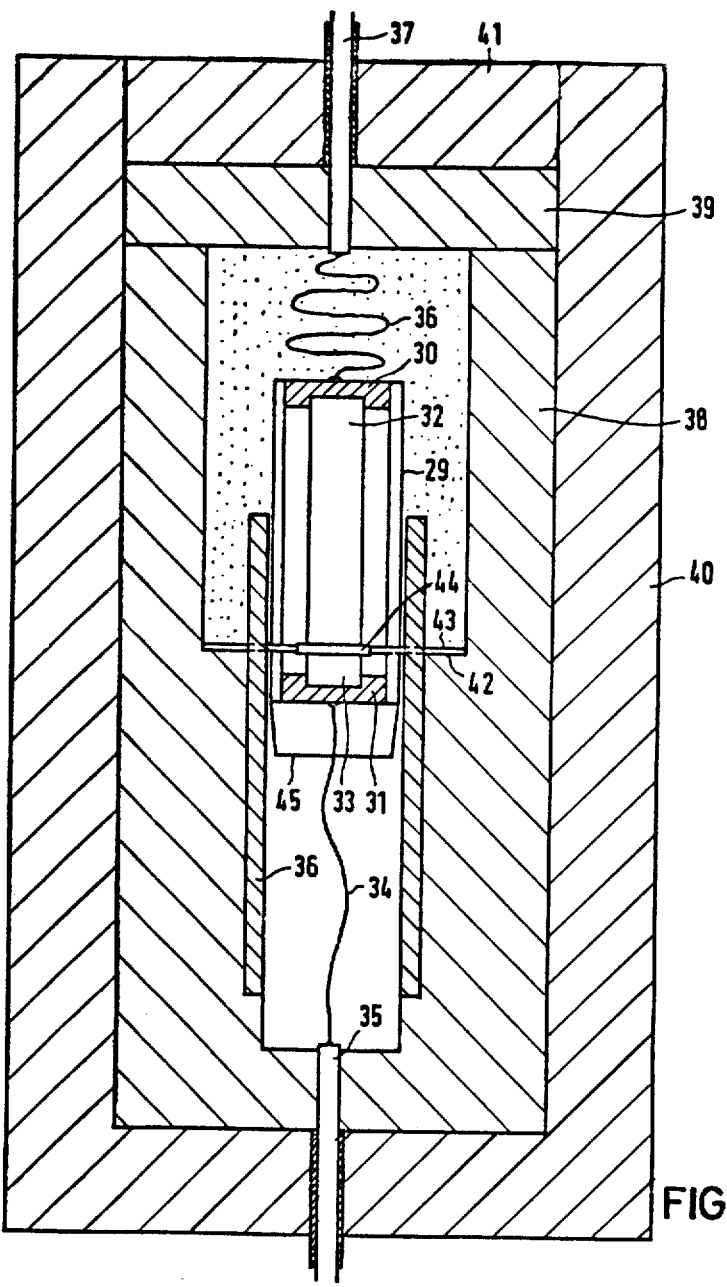
FIG. 6 shows an apparatus with a hermetic enclosure for carrying out the process according to the invention; and, FIG. 7 shows schematically the arrangement of two cross-section narrowers one behind the other.

FIG. 6 shows a hermetically enclosed modification of FIG. 5. A ceramic tube 29 holds two electrodes 30 and 31 which are also used as mounts. The electrode 30 holds a charge 32 and the electrode 31 holds a corresponding crystal body 33.

The electrode 31 is connected by means of a flexible electrical lead 34 to an electrical supply lead 35. Similarly, the electrode 30 is connected by an electrical lead 36 to an electrical supply lead 37.

The electrical supply lead 35 is taken through a ceramic housing whereas the electrical supply lead 37 is mounted in a ceramic cover 39 closing the housing. The housing 38, with the cover 39, is positioned in a pressure vessel 40 through which the supply lead 35 is taken in seal-tight manner known to the art. The pressure vessel 40 is closed in seal-tight manner by a cover 41. The electrical supply lead 37 is taken through cover 41 in a seal-tight manner.

The housing 38 comprises a shoulder 42 on which supporting rods 43 rest and hold a cross-section narrower 44.

In operation, the interior of pressure vessel 40 is subjected to a predetermined pressure depending on the material of the charge 32. For example, the pressure can be created by the evaporation of material constituting the charge 32. The current is switched on to produce heating and liquefying of the charge in the region of the cross-section narrower 44. As soon as liquefying occurs, the charge 32 and the crystal body 33, both held by the tube 29, descent due to the weight of the mobile system. The tube 29 is guided by a conical guide 45 in a ceramic tube 36. The tube 29 is slit so that the supporting rod 43 can extend freely through.

Figure 7:
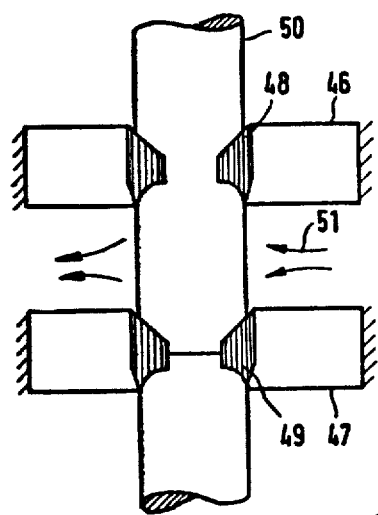

FIG. 7 shows two stationary holders 46 and 47 for two cross-section narrowers 48 and 49 which are spaced apart in the longitudinal direction of a charge 50 one behind the other. The cross-section narrowers 48 and 49 are sapphire rings, while the holders 46 and 47 from compressed ceramic wool and provide thermal insulation for the sapphire rings. As a result, the heat dissipation through the cross-section narrowers is reduced and the melting zone is formed without difficulty in the region of the cross-section narrowers 48 and 49.

The charge 50 moves substantially downward due to its own dead weight through the cross-section narrowers 48 and 49. This guarantees that below the cross-section narrower 48 the temperature cannot rise above the melting point of the charge, since heat is supplied to this portion of the charge, i.e. the crystal body is already crystallized-out once from both melting zones in the region of the cross-section narrowers 48 and 49. Cooling is affected through a flow of coolant (inert gas) in the direction of arrows 51. The material constituting the charge is, for example, aluminium.

The passage through the cross-section narrower can be given many different forms. As already mentioned, the cross-section may be annular, thus producing the tube. However, it is also possible to provide the cross-section narrower with several apertures which are closely adjacent to each other in such a manner that the molten material, after passing through the cross-section narrowers, unites again and forms a joint body. This form of the cross-section narrower gives a uniform cross-section reduction over the entire cross-sectional region of the charge, whereas when using only one passage, the molten material has to flow from the outside towards the inside through the passage, which in many cases, may be disadvantageous.

I claim as my invention:

1. A zone melting process for purifying a charge utilizing a narrower having an aperture therethrough, said aperture defining an inlet, a central region, and an outlet, the cross-sectional area of said central region being less than the cross-sectional area of said charge adjacent to said narrower, comprising the steps of:
    passing an alternating current longitudinally through said charge to heat said charge by Joule heating;
    driving said charge into direct physical contact with said narrower, through said inlet and into said central portion to reduce the cross-sectional area of a portion of said charge and define a zone of molten liquid in said charge, said zone being within and closely adjacent said aperture;
    continuing to pass said alternating current through said charge;
    causing said molten liquid to flow through said aperture and said outlet to increase the cross-sectional area of said zone and solidify said molten liquid exiting said aperture; and
    moving said charge relative to said narrower whereby said zone migrates through said charge.

2. A process as claimed in claim 1 further comprising the step of placing a crystal in contact within said molten liquid exiting said aperture.

3. A process as claimed in claim 1 wherein said aperture is a slot.

4. A process as claimed in claim 1 wherein said aperture is an annular ring.

5. A process as claimed in claim 1 wherein said inlet is funnel-shaped.

6. A process as claimed in claim 1 where said outlet widens in the direction of movement of said charge relative to said narrower.

7. A process as claimed in claim 1 wherein said driving step is accomplished by a constant force.

8. A process as claimed in claim 6 wherein said constant force is the weight of said charge.

9. An apparatus for purifying a charge comprising, in combination:
a narrower having an aperture therethrough, the cross-sectional area of said aperture being less than the cross-sectional area of said charge adjacent said narrower;
means for continually passing an alternating current longitudinally through said charge to Joule heat said charge;
means for driving said charge into physical contact with said narrower and into said perture to reduce the cross-sectional area of a portion of said charge within said aperture, said current being sufficient to melt said portion and form a zone of molten charge in and adjacent to said aperture, said driving means including means for moving said charge relative to said narrower to effect migration of said zone through said charge.

10. An apparatus as claimed in claim 9 further comprising a housing enclosing said narrower and said charge.

11. An apparatus as claimed in claim 10 wherein said housing is insulated.

12. An apparatus as claimed in claim 9 wherein said aperture is annular.

* * * * *